(12) United States Patent
Toyoda et al.

(10) Patent No.: US 7,411,733 B2
(45) Date of Patent: Aug. 12, 2008

(54) COMPOUND-EYE IMAGING DEVICE

(75) Inventors: Takashi Toyoda, Daito (JP); Yoshizumi Nakao, Daito (JP); Yasuo Masaki, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 114 days.

(21) Appl. No.: 11/550,075

(22) Filed: Oct. 17, 2006

(65) Prior Publication Data
US 2007/0090275 A1  Apr. 26, 2007

(30) Foreign Application Priority Data
Oct. 17, 2005 (JP) .............................. 2005-301379

(51) Int. Cl.
G02B 27/10 (2006.01)
(52) U.S. Cl. ...................... 359/619; 359/626; 359/634; 250/208.1
(58) Field of Classification Search ................ 359/619, 359/620, 625, 626, 628, 629, 634; 250/208.1; 349/95
See application file for complete search history.

(56) References Cited

U.S. PATENT DOCUMENTS 6,853,005 B2   2/2005   Ikeda
7,312,927 B2 *  12/2007  Bogner et al. ............... 359/630
2002/0030894 A1 *  3/2002  Volcker et al. .............. 359/619
2007/0097512 A1 *  5/2007  Toyoda et al. ............... 359/626

FOREIGN PATENT DOCUMENTS

| JP | 2003-179786 A | 6/2003 |
| JP | 2003-348297 A | 12/2003 |
| JP | 2004-226873 A | 8/2004 |
| JP | 2005-037891 A | 2/2005 |

* cited by examiner

Primary Examiner—Huy K Mai
(74) Attorney, Agent, or Firm—Crowell & Moring LLP

(57) ABSTRACT

A compound-eye imaging device comprises: an optical lens array with integrated optical lenses; a stop member for shielding unnecessary ambient light from entering the optical lenses; a photodetector array formed of a semiconductor substrate and placed at a predetermined distance from the optical lens array for imaging images formed by the optical lenses; a light shielding block placed between the two arrays; and an optical filter for transmitting light from the optical lenses in a specific wavelength range. The optical filter is a part of, and integral with, the photodetector array. The optical filter can be a deposited film formed by depositing silicon oxide and titanium oxide on a glass plate provided for protecting a surface of, and integrally formed on, the semiconductor substrate. This enables to easily omit an optical filter separately provided between the two arrays, thereby reducing the thickness of the imaging device.

6 Claims, 3 Drawing Sheets

COMPOUND-EYE IMAGING DEVICE

BACKGROUND OF THE INVENTION

1. Field of the Invention

The present invention relates to a compound-eye imaging device having an optical imaging system which is formed of multiple micro optical systems so as to reduce the focal length, thereby reducing the thickness of the compound-eye imaging device.

2. Description of the Related Art

There has been developed a compound-eye imaging device as a thin camera module to be installed in a cellular phone, a personal computer, or the like. The compound-eye imaging device is mainly composed of: an optical lens array with multiple integrated optical lenses having mutually parallel optical axes; a photodetector array for imaging multiple images (single-eye images) formed by the respective optical lenses of the optical lens array; and an image reconstructing circuit for reconstructing the multiple single-eye images, imaged by the photodetector array, into one image by using parallax information between the multiple single-eye images. The compound-eye imaging device further comprises: a light shielding block which is placed between the optical lens array and the photodetector array, and which has a partition wall for preventing lights emitted from the respective optical lens from interfering each other; and an optical filter for transmitting only visible light among light components emitted from the optical lenses so as to improve the color reproducibility.

Examples of the optical filter to be used are a glass plate with a multi-layer film deposited on the surface thereof, and a plastic or glass plate with a near-infrared light absorbing material mixed therein, in which the glass plate or the plastic plate is placed separately from and between the optical lens array and the photodetector array. Some technologies are known to deposit a material selected from various metals and resins on the surface of an optical lens so as to form an optical filter with the thus deposited layer (refer to e.g. Japanese Laid-open Patent Publications 2004-226873, 2003-179786, 2005-37891 and 2003-348297).

Referring now to FIG. 5, a specific structure of a conventional compound-eye imaging device 104 will be described. FIG. 5 is a schematic side cross-sectional view of the conventional compound-eye imaging device 101. The compound-eye imaging device 101 comprises: an optical lens array 103 having multiple optical lenses 102 which have optical axes L parallel to each other, and which are mutually integrally formed on one plate; and a stop member 104 placed above the optical lens array 103 for shielding unnecessary ambient light from being incident on, or entering, the respective optical lenses 102. The compound-eye imaging device 101 further comprises: a photodetector array 105 placed below the optical lens array 103 for imaging multiple images respectively formed by the optical lenses 102; a light shielding block 106 which is placed between the optical lens array 103 and the photodetector array 105, and which has a partition wall for partitioning a space between the optical lens array 103 and the photodetector array 105 into a matrix of spaces as seen on a plane perpendicular to the optical axes L so as to prevent lights emitted from the respective optical lens 102 from interfering each other; and an optical filter 107 fixed to a bottom surface of the light shielding block 106 for transmitting only visible light.

The photodetector array 105 is formed of a semiconductor substrate 105a, forming e.g. a CMOS (Complementary Metal Oxide Semiconductor) image sensor, and has a thin glass plate (cover glass) 105b for protecting the surface of the semiconductor substrate 105a. Provided on an extension of the semiconductor substrate 105a is an electronic circuit (not shown) for electrically processing and reconstructing the multiple images formed on the photodetector array 105 into one image.

The compound-eye imaging device 101 is desired to be as thin as possible to be installed in a cellular phone, a personal computer, or the like. However, the stop member 104, optical lenses 102, light shielding block 106, optical filter 107 and photodetector array 105, which are arranged along the optical axes L of the optical lenses 102, are all indispensable elements and cannot be omitted. Furthermore, the distance d between the optical lens array 103 and the photodetector array 105 cannot be easily reduced, because the distance d is determined by the focal length of each optical lens 102.

Furthermore, the presence of the optical filter 107 between the optical lens array 103 and the photodetector array 105 causes the focal length of each optical lens 102 to be longer, causing a problem that the distance d between the optical lens array 103 and the photodetector array 105 inevitably increases. More specifically, the presence of a material having a refractivity higher than that of air causes the flange back of the optical lens 102 to be longer than that without the presence of the material by the sum of the thickness of the material and a predetermined length determined by the refractivity. For example, in the compound-eye imaging device 101, assuming that the optical filter 107 is formed of a plate having a refractivity of 1.5 and a thickness of 0.3 mm, the focal length of the optical lens 102 is lengthened by about 0.1 mm. This causes the distance d between the optical lens array 103 and the photodetector array 105 to be inevitably lengthened by about 0.1 mm as well.

If the optical filter 107 is placed outside the optical lenses 102 (i.e. on the object side of the compound-eye imaging device 101), the above-described problem of the lengthening of the flange back by the optical filter does not occur. However, in this case, the thickness of the compound-eye imaging device includes the thickness of the optical filter itself as an additional thickness added to the distance d between the optical lens array 103 (optical lenses 102) and the photodetector array 105. This causes the compound-eye imaging device to be still thick. One way of preventing the lengthening of the focal length of each optical lens may be to deposit a multi-layer film on the surface of the optical lens in a manner described in the above patent publications such as Japanese Laid-open Patent Publication 2004-226873 so as to form an optical filter, thereby omitting the optical filter 107 present between the optical lens array 103 and the photodetector array 105. However, it is not easy to deposit a uniform multi-layer film on the optical lens, which has a convex surface.

SUMMARY OF THE INVENTION

An object of the present invention is to provide a compound-eye imaging device which can be reduced in its entire thickness, and can be easily manufactured.

According to the present invention, this object is achieved by a compound-eye imaging device comprising: an optical lens array with multiple integrated optical lenses having optical axes parallel to each other; a stop member for shielding unnecessary ambient light from entering the optical lenses; a photodetector array formed of a semiconductor substrate and placed at a predetermined distance from the optical lens array for imaging multiple images which are respectively formed by the optical lenses; a light shielding block which is placed between the optical lens array and the photodetector array, and which has a partition wall for partitioning a space between the optical lens array and the photodetector array into a matrix of spaces as seen on a plane perpendicular to the optical axes so as to prevent lights emitted from the respective optical lens from interfering each other; and an optical filter for transmitting light in a specific wavelength range among light components emitted from the optical lenses. The optical filter is a part of, and integral with, the photodetector array.

Since the optical filter according to the compound-eye imaging device of the present invention is integrally formed with, and as a part of, the photodetector array, it can solve the problem of lengthening of the flange back of each optical lens occurring in a conventional compound-eye imaging device which uses e.g. a glass plate as a base material for an optical filter, and which places the optical filter separately from and between the optical lens array and the photodetector array. This enables reduction of the entire thickness of the compound-eye imaging device.

Preferably, the optical filter is formed of a deposited film on a glass plate as a surface protection member for protecting a surface of the semiconductor substrate of the photodetector array, in which the deposited film is formed by alternately depositing silicon oxide and titanium oxide on either a front surface or a rear surface of the glass plate as a surface protection member. This makes it easier to form a uniform deposited multi-layer film because the surface (either front or rear) of the glass plate as a surface protection member which is provided for protecting the semiconductor substrate and on which the deposited film is formed is flat, in contrast to a conventional compound-eye image device as described in e.g. Japanese Laid-open Patent Publication 2004-226873 in which a deposited multi-layer film is formed on the surface of each optical lens having a convex surface.

The optical filter can be formed of an organic laminate film bonded to a surface of the semiconductor substrate of the photodetector array, the organic laminate film also serving as a surface protection member to protect the surface of the semiconductor substrate.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein.

DESCRIPTION OF THE PREFERRED EMBODIMENTS

Figure 1:
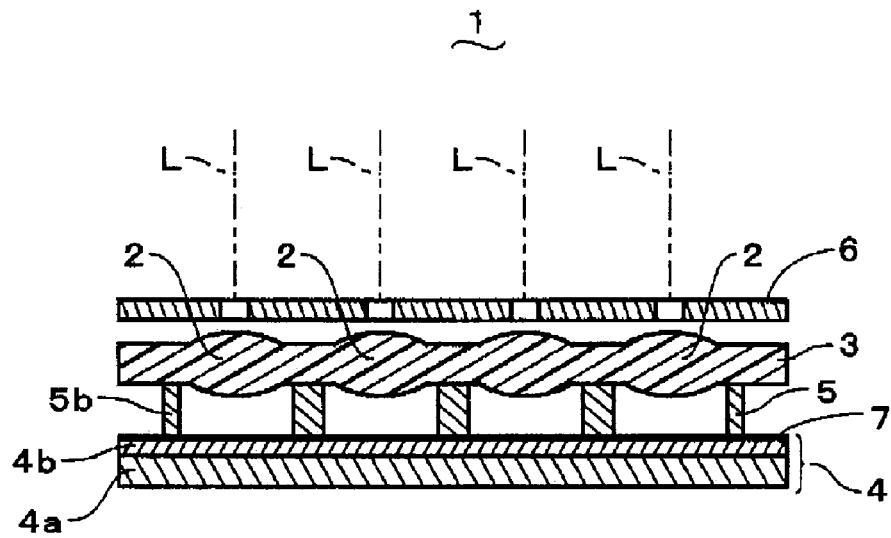
FIG. 1 is a schematic side cross-sectional view of a compound-eye imaging device according to a First Embodiment of the present invention along line X-X' of FIG. 2.

Embodiments of the present invention, as best mode for carrying out the invention, will be described hereinafter with reference to the drawings. The present invention relates to a compound-eye imaging device. It is to be understood that the embodiments herein are not intended as limiting, or encompassing the entire scope of, the invention. Note that like parts are designated by like reference numerals or characters throughout the drawings.

First Embodiment

Figure 2:
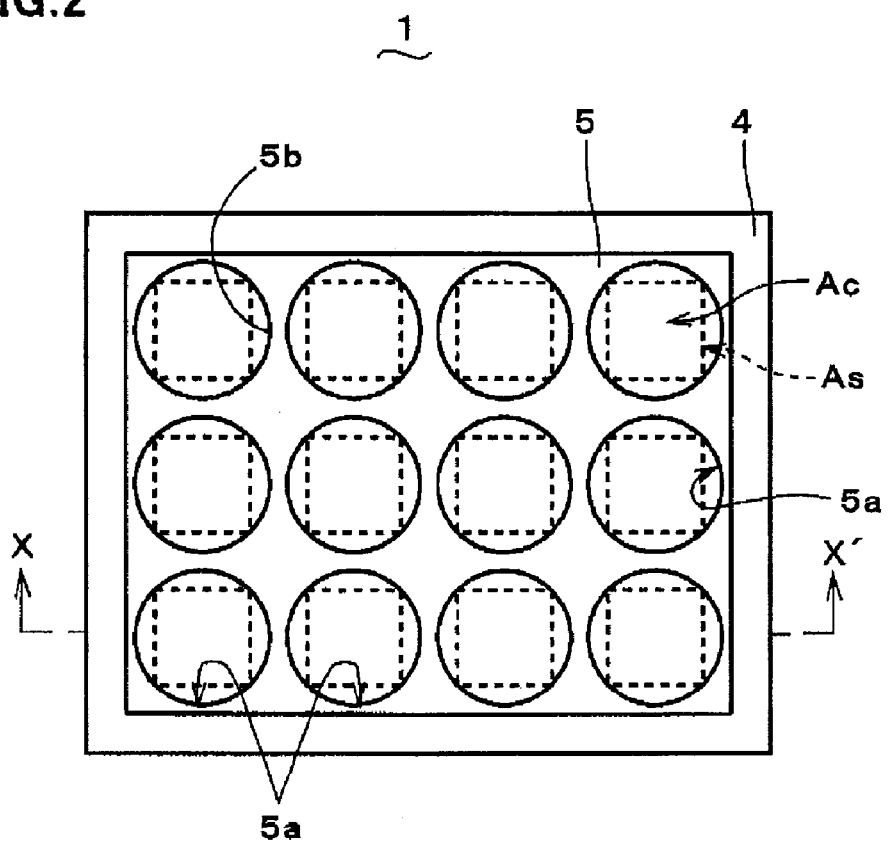
FIG. 2 is a schematic plan view of the compound-eye imaging device showing a light shielding block and a photodetector array.

A First Embodiment of the present invention will be described with reference to FIG. 1, FIG. 2 and FIG. 3. FIG. 1 is a schematic side cross-sectional view of a compound-eye imaging device according to the First Embodiment of the present invention along line X-X' of FIG. 2, while FIG. 2 is a schematic plan view of the compound-eye imaging device 1. As shown in FIG. 1 and FIG. 2, the compound-eye imaging device 1 comprises: an optical lens array 3 having 12 (twelve) optical lenses 2 as 12 single or unit eyes which have optical axes L parallel to each other, and which are arranged in a matrix of three rows and four columns and mutually integrally formed on one plate; and a photodetector array 4 which is placed below, and at a predetermined distance from, the optical lens array 3, and which has 12 light receiving elements, also arranged in a matrix of three rows and four columns corresponding to the optical lens array 3, for imaging 12 single-eye images Ac formed by the 12 optical lenses 2.

The compound-eye imaging device 1 further comprises: a light shielding block 5 which is placed between the optical lens array 3 and the photodetector array 4, and which has a partition wall 5b for partitioning a space between the optical lens array 3 and the photodetector array 4 into a matrix (three rows/four columns) of spaces as seen on a plane perpendicular to the optical axis L so as to prevent lights emitted from the respective optical lens 2 from interfering each other; and a stop member 6 placed above the optical lens array 3 for shielding unnecessary ambient light from being incident on, or entering, the respective optical lenses 2.

As shown in FIG. 2, the light shielding block 5 and the photodetector array 4 are each rectangular plate-shaped, and placed to overlap each other as seen in plan view. The photodetector array 4 is formed of a semiconductor substrate 4a having a rectangular shape as seen in plan view, and is, for example, a CMOS (Complementary Metal Oxide Semiconductor) image sensor or a CCD (Charge Coupled Device) image sensor. The photodetector array 4 has a thin glass plate (cover glass) 4b bonded to the surface of the semiconductor substrate 4a.

The thin glass plate 4b is a member provided for the purpose of preventing the semiconductor substrate 4a from being damaged in a process of manufacturing the photodetector array 4 itself, and in a process of assembling the resultant manufactured photodetector array 4 with e.g. the optical lens array 3. The glass plate 4b corresponds to claimed "surface protection member" for protecting the surface of the semiconductor substrate 4a, and can be regarded as a part of, and forming a surface of, the photodetector array 4. The light shielding block 5 is a rectangular parallelepiped block also having a rectangular shape as seen in plan view, which however is a little smaller than that of the light receiving element 4. The light shielding block 5 is formed of a partition wall 5b which has circular apertures 5a facing the respective optical lenses 2 of the optical lens array 3, and which partitions the space between the optical lens array 3 and the photodetector array 4 into a matrix of spaces as seen on a plane perpendicular to each optical axis L.

In the present Embodiment, a deposited film 7 is formed on a front or upper surface of the glass plate 4b as a surface protection member to protect the surface of the semiconductor substrate 4a of the photodetector array 4. A feature of the present invention is that the deposited film 7 is thus integral with the photodetector array 4, which has the glass plate 4b as a part thereof, in order to reduce the total thickness of the compound-eye imaging device 1. The deposited film 7 is a multi-layer film having 40 to 50 layers formed by alternately depositing silicon oxide ($SiO_2$) and titanium oxide ($TiO_x$), and serves as an optical filter to transmit light in a specific wavelength range, here only visible light, among light components incident on the compound-eye imaging device 1 and emitted from the optical lenses 2, while reflecting the remaining light components. Thus, the optical filter (deposited film 7) is a reflection and transmission type filter, and is integral with the photodetector array 4 which has the glass plate 4b as a part thereof. At a last stage of manufacturing the photodetector array 4, the semiconductor substrate 4a and the glass plate 4b, as a surface protection member, having been manufactured respectively in separate processes are bonded to each other, whereas prior to the bonding, the deposited film 7 is formed on the glass plate 4b as a surface protection member in the process of manufacturing the glass plate 4b.

According to the compound-eye imaging device 1, light from an object to be imaged is limited by the stop member 6 to a predetermined amount and is incident on the 12 optical lenses 2 of the optical lens array 3. On the other hand, lights emitted from the respective optical lens 2 arrive on the semiconductor substrate 4a via the optical filter (deposited film 7) without interfering each other because of the partition wall 5b of the light shielding block 5 so as to each form a circular image (single-eye image) Ac, corresponding to each circular aperture 5a of the light shielding block 5, on each light receiving element of the photodetector array 4. The 12 single-eye images Ac formed on the photodetector array 4 are respectively converted to electric signals, and are input either to a microprocessor provided on the same semiconductor substrate 4a that forms the photodetector array 4, or to a microprocessor in e.g. an external personal computer connected via an interface to the compound-eye imaging device 1. The microprocessor in either case reconstructs the thus input electric signals into one image to be displayed on a display unit such as an LCD (Liquid Crystal Display) monitor 9.

Figure 3:
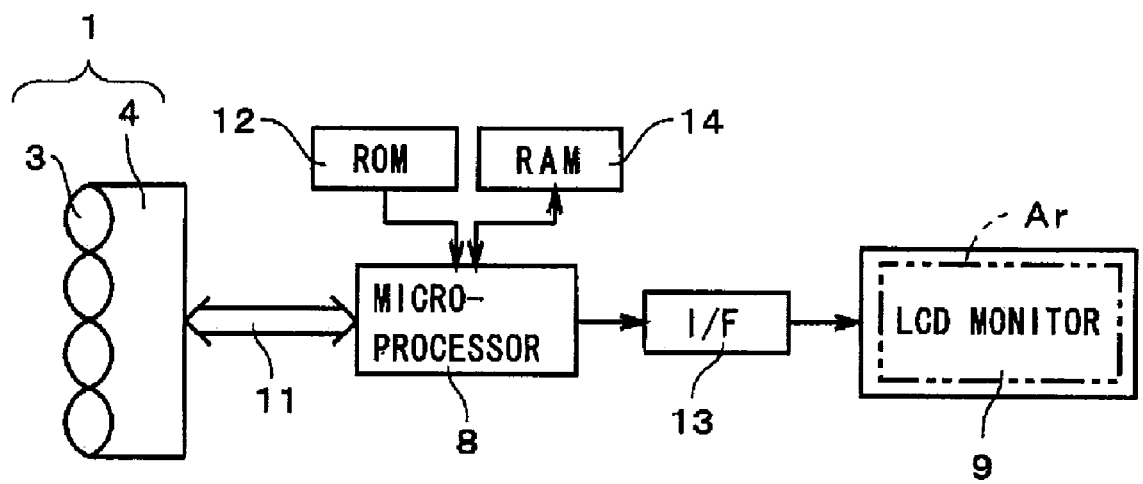
FIG. 3 is a schematic block diagram of a circuit configuration connected to the compound-eye imaging device.

FIG. 3 is a schematic block diagram of a circuit configuration which is connected to the compound-eye imaging device 1, and which includes a microprocessor 8 connected to the photodetector array 4 and an LCD monitor 9. The photodetector array 4 is connected to the microprocessor 8 via a bus 11. Based on operations of a predetermined processing program stored in a ROM (Read Only Memory) 12, the microprocessor 8 processes electric signals of the respective single-eye images Ac input thereto from the photodetector array 4, and reconstructs the electric signals into one image Ar, and further outputs the image Ar on the LCD monitor 9 via an interface (I/F) 13. The microprocessor 8 temporarily stores, in a RAM (Random Access Memory), various computational results obtained by the operations of the processing program.

The microprocessor 8 processes the electric signals of the single-eye images Ac in two processes: (a) a process to cut out, from each of the 12 circular single-eye images Ac, a square image As inscribed inside the circle of each circular single-eye image Ac; and (b) a process to reconstruct the thus cut-out 12 square images As into one image Ar by using parallax information between the 12 single-eye images Ac.

Although the microprocessor 8 thus performs the processes in the present Embodiment, it is also possible to design so that the two processes are performed by separately provided microprocessors or ICs (integrated circuits). Note that it is a well-known technology to reconstruct multiple images into one image by using parallax information between the multiple images.

As described in the foregoing, according to the compound-eye imaging device 1 of the present Embodiment, an optical filter is formed by a deposited film 7 which is formed by alternately depositing silicon oxide and titanium oxide on the photodetector array 4, more specifically on the glass plate 4b as a surface protection member for the semiconductor substrate 4a. This makes it possible to omit a conventional optical filter which uses e.g. a glass plate as a self-supporting base and is present between an optical lens array (optical lenses) and a photodetector array in a compound-eye imaging device. The present Embodiment thus enables a thin compound-eye imaging device 1 with a reduced total thickness without lengthening the flange back of each optical lens 2. Since the glass plate 4b as a surface protection member has a flat surface, it is easy to form a uniform deposited film 7 on the glass plate 4b as a surface protection member.

Note that in the present Embodiment, the deposited film 7 is formed on the front or upper surface (surface facing each optical lens 2) of the glass plate 4b for surface protection, but instead can be formed on a rear or lower surface (surface facing the semiconductor substrate 4a) of the glass plate 4b. It is easy to form the deposited film 7 on the rear surface of the glass plate 4b as a surface protection member because the semiconductor substrate 4a and the glass plate 4b are manufactured in separate processes. Further, the optical filter formed of the deposited film 7 can be not only a filter to transmit only visible light, but can be a filter to transmit only infrared light, or a filter to transmit light in a wavelength range from visible to infrared.

Second Embodiment

Figure 4:
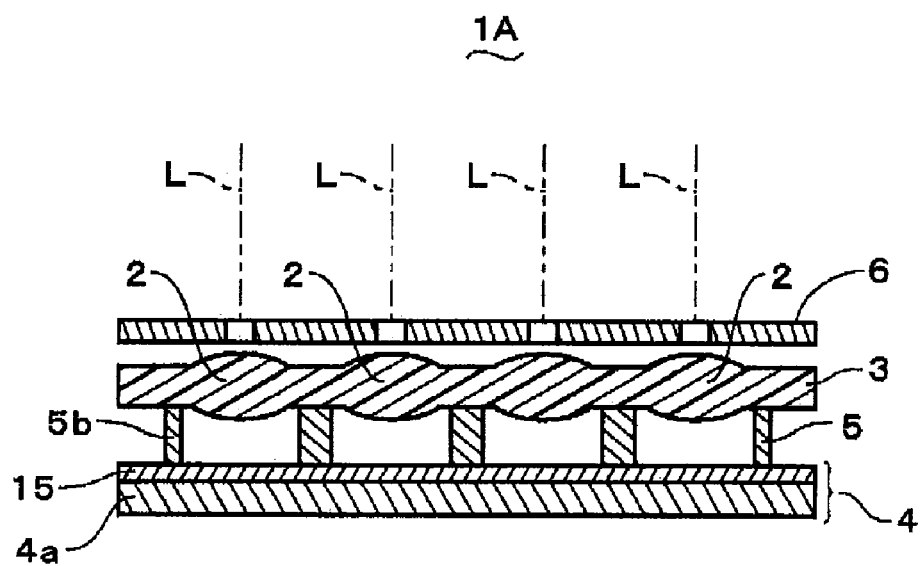
FIG. 4 is a schematic side cross-sectional view of a compound-eye imaging device according to a Second Embodiment of the present invention.
Figure 5:
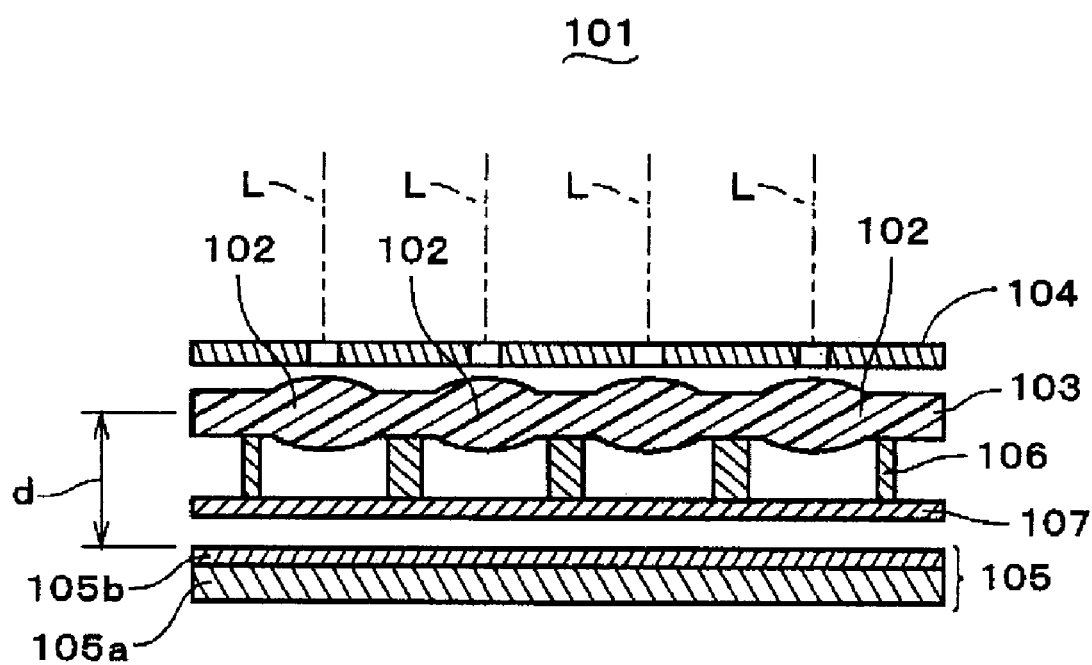
FIG. 5 is a schematic side cross-sectional view of a conventional compound-eye imaging device.

FIG. 4 is a schematic side cross-sectional view of a compound-eye imaging device 1A according to a Second Embodiment of the present invention which corresponds to the side cross-sectional view of the compound-eye imaging device 1 according to the First Embodiment shown in FIG. 1. Referring to FIG. 4, the compound-eye imaging device 1A of the Second Embodiment will be described. In the Second Embodiment, an organic laminate film 15 is used instead of the combination of the glass plate (cover glass) 4b and the deposited film 7 in the First Embodiment as an optical filter and a member for protecting the surface (claimed "surface protection member") of a semiconductor substrate 4a which forms a photodetector array 4. Thus, the organic laminate film 15 serves as both an optical filter and a surface protection member, and is also a part of, and integral with, the photodetector array 4. The other elements of the compound-eye imaging device 1A of the present Embodiment are the same as those of the compound-eye imaging device 1 of the First Embodiment, and are designated by the same reference numerals, detailed description of which is thus omitted here.

The organic laminate film 15 is bonded to the surface of the semiconductor substrate 4a in the process of manufacturing the photodetector array 4. The organic laminate film 15 is formed of layers of acryl and polyester, and more specifically has a multi-layer structure having layers of acryl and layers of polyester stacked in 400 to 500 layers, whereby the organic laminate film 15 has both a function of a surface protection member which protects the surface of the semiconductor substrate 4a, and a function of an optical filter which transmits light in a specific wavelength range, more specifically here only visible light, among light components incident on the compound-eye imaging device 1A and emitted from the optical lenses 2, while reflecting the remaining light components. An advantage of the organic laminate film 15 is that it can hold its shape by itself without the need for a base such as a glass plate, a plastic plate, or the like, and it can be significantly thinner (e.g. as thin as 0.09 mm) than an optical filter using a self-supporting glass plate as a base as in e.g. a conventional compound-eye imaging device. This facilitates easy handling of the organic laminate film 15 when bonding it to the semiconductor substrate 4a.

Thus, according to the Second Embodiment, the organic laminate film 15, which is bonded to the semiconductor substrate 4a and protects the surface of the semiconductor substrate 4a, serves as an optical filter, so that it is possible to omit a conventional optical filter which uses e.g. a glass plate as a base therefor and which is placed separately from and between a light receiving element and an optical lens array (optical lenses) as in a conventional compound-eye imaging device, thereby enabling a thin compound-eye imaging device 1A with a reduced total thickness without lengthening the flange back of each optical lens 2. Furthermore, since it is only needed to bond the organic laminate film 15 to the surface of the semiconductor substrate 4a, it is easy to manufacture the photodetector array 4 in the compound-eye imaging device 1A.

Note that in the present Embodiment, the organic laminate film 15 is directly bonded to the surface of the semiconductor substrate 4a, but can be bonded to a glass plate for surface protection (such as the glass plate 4b in the First Embodiment) which is integrally formed on the semiconductor substrate 4a. In this case, the semiconductor substrate 4a, the glass plate for surface protection and the organic laminate film 15 are stacked in this order. Furthermore, the optical filter formed of the organic laminate film 15 can be not only a filter to transmit only visible light, but also a filter to transmit only infrared light, or even a filter to transmit light in a wavelength range from visible to infrared.

As described in the foregoing, the compound-eye imaging device according to the present invention has no optical filter using e.g. a glass plate which is placed separately from and between the optical lens array (array 3 or optical lenses 2) and the photodetector array (array 4), so that the flange back of each optical lens (lens 2) can be prevented from being lengthened, thereby preventing the distance between the optical lens array and the photodetector array from increasing. Accordingly, the compound-eye imaging device can be made thinner with a reduced total thickness, so that it is possible to reduce space in a cellular phone, a personal computer or the like for installing the compound-eye imaging device. In addition, it is easier to manufacture the photodetector array in the compound-eye imaging device according to the present invention than in a conventional compound-eye image device of a type in which a multi-layer film is deposited on the surface of each optical lens having a convex surface.

The present invention has been described above using presently preferred embodiments, but such description should not be interpreted as limiting the present invention. Various modifications will become obvious, evident or apparent to those ordinarily skilled in the art, who have read the description, Accordingly, the appended claims should be interpreted to cover all modifications and alterations which fall within the spirit and scope of the present invention.

This application is based on Japanese patent application 2005-301379 filed Oct. 17, 2005, the content of which is hereby incorporated by reference.

What is claimed is:

1. A compound-eye imaging device comprising:
   an optical lens array with multiple integrated optical lenses having optical axes parallel to each other;
   a stop member for shielding unnecessary ambient light from entering the optical lenses;
   a photodetector array formed of a semiconductor substrate and placed at a predetermined distance from the optical lens array for imaging multiple images which are respectively formed by the optical lenses;
   a light shielding block which is placed between the optical lens array and the photodetector array, and which has a partition wall for partitioning a space between the optical lens array and the photodetector array into a matrix of spaces as seen on a plane perpendicular to the optical axes so as to prevent lights emitted from the respective optical lens from interfering each other; and
   an optical filter for transmitting light in a specific wavelength range among light components emitted from the optical lenses,
   wherein the optical filter is a part of, and integral with, the photodetector array.

2. The compound-eye imaging device according to claim 1, wherein the optical filter is formed of a deposited film on a glass plate as a surface protection member for protecting a surface of the semiconductor substrate of the photodetector array, in which the deposited film is formed by alternately depositing silicon oxide and titanium oxide on either a front surface or a rear surface of the glass plate as the surface protection member.

3. The compound-eye imaging device according to claim 2, wherein the deposited film is a multi-layer film having 40 to 50 layers formed by alternately depositing silicon oxide and titanium oxide.

4. The compound-eye imaging device according to claim 1, wherein the optical filter is formed of an organic laminate film bonded to a surface of the semiconductor substrate of the photodetector array, the organic laminate film also serving as a surface protection member to protect the surface of the semiconductor substrate.

5. The compound-eye imaging device according to claim 4, wherein the organic laminate film is formed of layers of acryl and polyester.

6. The compound-eye imaging device according to claim 5, wherein the organic laminate film has a multi-layer structure having layers of acryl and layers of polyester stacked in 400 to 500 layers.

* * * * *